United States Patent [19]
Altman

[11] 3,951,535
[45] *Apr. 20, 1976

[54] LOW PROFILE EPISCOPIC PROJECTOR

[76] Inventor: Gerald Altman, 41 Westminster Road, Newton, Mass. 02159

[ * ] Notice: The portion of the term of this patent subsequent to Apr. 20, 1993, has been disclaimed.

[22] Filed: Feb. 12, 1975

[21] Appl. No.: 549,351

Related U.S. Application Data

[63] Continuation-in-part of Ser. No. 500,322, Aug. 26, 1974, which is a continuation-in-part of Ser. No. 329,574, Feb. 5, 1973, Pat. No. 3,837,739, and a continuation-in-part of Ser. No. 419,063, Nov. 26, 1973, each is a continuation-in-part of Ser. No. 81,987, Oct. 19, 1970, Pat. No. 3,778,142.

[52] U.S. Cl. .................................... 353/66; 353/65
[51] Int. Cl.² ................... G03B 21/06; G03B 21/08
[58] Field of Search ................... 353/65, 66, 44, 45, 353/121, 122; 350/109, 199, 202

[56] References Cited
UNITED STATES PATENTS
3,837,739  9/1974  Altman ................................. 353/66

*Primary Examiner*—Richard E. Aegerter
*Assistant Examiner*—Larry Jones
*Attorney, Agent, or Firm*—Morse, Altman, Oates & Bello

[57] ABSTRACT

The design of a large copy projector is such that its projection path extends rearwardly and obliquely so that the projector and the viewing screen can be viewed side-by-side. This projector uses an opaque copy sheet characterized by an under specularly reflecting face that is accessible to the optical system from below but that can be marked from above by a chemical reactant ink from a user's pen or the like. Simultaneously, the upper face is unobstructedly available for direct observation and manual access and the lower face is unobstrusively available for imaging projection through a folded optical path below the copy sheet, which is established by a short throw, oblique incidence catadioptric optical system.

7 Claims, 9 Drawing Figures

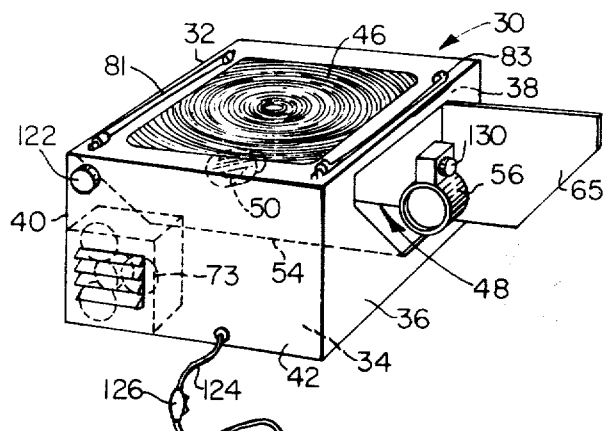
FIG. 1
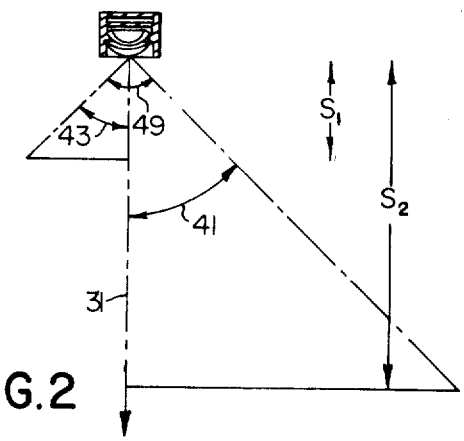
FIG. 2
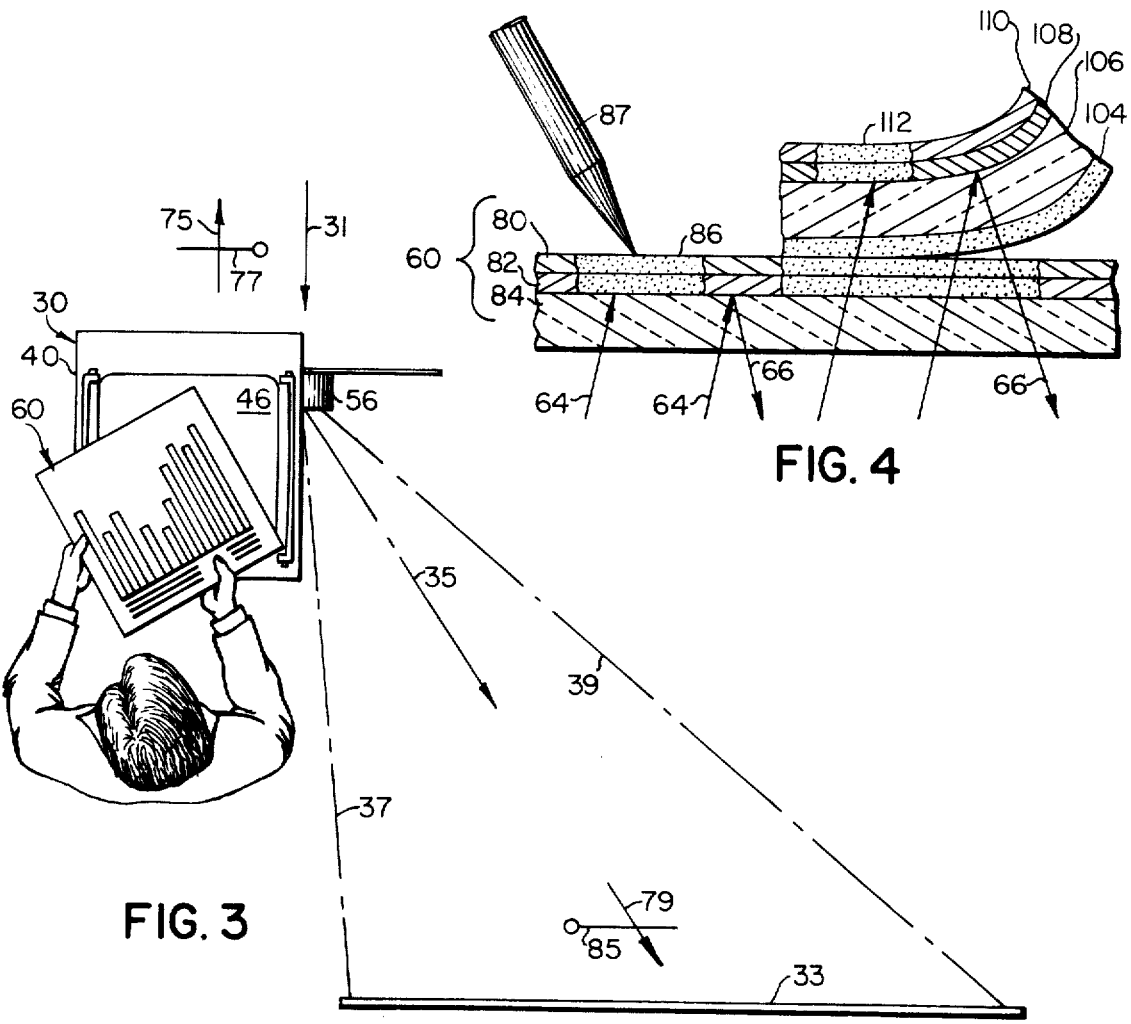
FIG. 3
FIG. 4

LOW PROFILE EPISCOPIC PROJECTOR

RELATED APPLICATIONS

The present application is a continuation-in-part of application Ser. No. 500,322, filed Aug. 26, 1974, which in turn is a continuation-in-part of Ser. No. 329,574, filed Feb. 5, 1973, now Pat. No. 3,837,739, reissued Sept. 24, 1974, and a continuation-in-part of application Ser. No,. 419,063, filed Nov. 26, 1973, both the latter two applications, in turn, being continuation-in-part of application Ser. No. 81,987, filed Oct. 19, 1970, now Pat. No. 3,778,142, issued Dec. 11, 1973, and reissued as Pat. No. Re28,274, dated Dec. 17, 1974.

BACKGROUND AND SUMMARY

The present invention relates to optical imaging and, more particularly, to systems, processes and products involving episcopic imaging, i.e. imaging utilizing light generally reflected from or at a copy sheet or other visual subject, as distinguished from diascopic imaging, i.e. imaging utilizing light generally directed through a copy sheet. The present invention is directed primarily to large copy projectors, exemplified by so-called "overhead" and "opaque" projectors. Diascopic overhead projectors have been characterized by: bulky hardware that obtrudes between the audience and the projected image and causes the operator to assume an unnatural posture in order not to obtrude between the projection lens and the screen; and transparencies that are uncomfortable for the opertor to view, handle and store. Episcopic overhead projectors theoretically are more compact than diascopic overhead projectors because illuminating source and imaging lens are at the same side of the copy sheet, whereby vertical dimensions are reduced. But, in practice, episcopic overhead projectors also have been obtrusive because either (1) the light source and imaging lens are positioned by a post in a sizeable casing above the copy sheet or (2) a bulky housing envelops the light paths to and from the copy sheet in order to control glare. Episcopic copy, when composed of paper or sheeting of equivalent appearance, has not been adapted for brilliant imaging because of its optical diffusivity.

The primary object of the present invention is the provision of systems, processes and products involving a portable projector and a thin reflectorized plastic copy sheet assemblage that are particularly interrelated to achieve, during projection, direct visual and manual access to the copy sheet by the operator, absolute shielding of the operator and the audience from illuminating light, audience viewing of the projector (together with the operator) and the screen in side-by-side relation, and natural posture of the operator at the projector. The optical projector comprises a low profile housing in which are positioned an upper Fresnel lens underlying the copy sheet, which has its front face upward for direct viewing, a source of illuminating light from which the exterior of the housing is absolutely shielded by the copy sheet itself, and a folded optical path below the Fresnel lens to a wide angle catadioptric reflector at the side of the projector. The catadioptric objective reflector has an extremely wide field angle and a pair of semi-field conjugate surfaces, both on the same axial side of the catadioptric reflector, one of which is disposed at the visual transparency and the other of which is disposed at the viewing screen. The arrangement is such that an unusually powerful illuminating lamp is practicable. The copy sheet is characterized by a lower reflecting face that is accessible to the optical system from below but that can be marked from above by a chemical reactant ink from a pen which is manually held by an operator. Corrections can be made by a chemical etching patch which can clear sections of the lower reflecting face for marking. The thin reflectorized plastic copy sheet is tensioned above the Fresnel lens in order to achieve high quality optical reflective imaging. The tensioning mechanism interacts with the illuminating source so that dimming occurs during copy sheet exchange.

Other objects of the present invention will in part be obvious and will in part appear hereinafter.

The invention accordingly comprises the systems, processes and products, together with their components, steps, parts and interrelationships, which are exemplified by the present disclosure, the scope of which will be indicated in the appended claims.

BRIEF DESCRIPTION OF DRAWINGS

For a fuller understanding of the nature and objects of the present invention, reference is made to the following detailed description, taken in connection with the accompanying drawings, wherein:

FIG. 1 is a perspective view of a large copy projector system embodying the present invention;

FIG. 2 is a diagram illustrating certain principles of the present invention;

FIG. 3 is a top plan view illustrating the side-by-side relation between the projector and the viewing screen in accordance with the present invention;

FIG. 4 is an exaggerated cross-sectional view of graphic materials useful in connection with the projector of FIG. 1;

DETAILED DESCRIPTION

Figure 5:
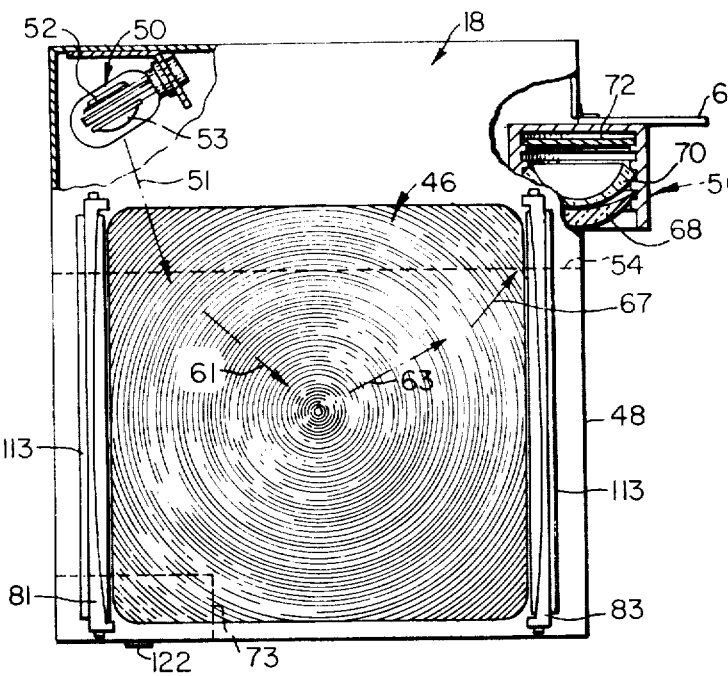
FIG. 5 is a top plan view of the projector of FIG. 1.

A large copy projector embodying the present invention, i.e. for copy greater than 6 × 6 inches in area, is shown in FIG. 1 as including a housing 30, which mounts and contains the operating optical components. As shown, housing 30 is in the form of a sheet metal enclosure having a flat base panel 34, a flat side panel 36, a flat front panel 38, a flat side panel 40, and a rear panel 42. Panel 34 is generally horizontal and panels 36, 38, 40 and 42 are generally vertical. At the top of the housing is a stage 32 having an opening which encompasses an optically clear, generally horizontal, glass or plastic Fresnel lens 46, the lower face of which is flat and the upper face of which has a Fresnel lens configuration, i.e. a series of concentric, circularly developed, generally conic, refracting ridges. Side panel 36 has a projection opening 48. Opening 48 has an oblique rearward edge, a vertical forward edge that is adjacent to front panel 38 and upper and lower generally horizontal edges. A closure 65, having a profile that registers with the profile of opening 48, is hinged to panel 36 for pivotal constraint about the axis of the vertical forward edges of the opening and the closure. As shown in FIG. 3, side panels 36, 40 are disposed substantially along a viewing axis 31 and projection to a viewing screen 33 occurs along a path having a projection axis 35 and diverging boundaries 37, 39. It will be observed that, with respect to viewing axis 31, screen 33 and projector 30 are viewed by an audience side-by-side.

The optical components include: an illuminating lamp 50, associated with a reflecting spherical mirror 52 and a heat absorbing condensing lens 53, disposed along an illuminating axis; a deflecting plane mirror 54 generally underlying Fresnel lens 46 along a plane obliquely intersecting the axis of the Fresnel lens; and a catadioptric objective reflector 56 having an optical axis that is generally parallel to viewing axis 31 but that intersects projection axis 35 at an acute angle. Objective reflector 56 has a wide field angle 49, preferably of at least 75°. The arrangement is such that the field angle segment 41 subtended by viewing screen 33 and the field angle segment 43 subtended by Fresnel lens 46 each is at most one half of the total field angle. Consequently, since axis 31 is approximately perpendicular to the plane of viewing screen 33, keystoning is minimized. A shown in FIGS. 5 and 6, the rearward and forward edges of deflecting mirror 54 are straight, the rear edge being approximately parallel to and relatively contiguous with the rear edge of the Fresnel lens and the forward edge being approximately parallel to and relatively remote from the front edge of the Fresnel lens. Objective reflector 56 is mounted on a closure 65 so as to be within housing 18 when closure 65 is closed and so as to be accessible optically to both deflecting mirror 54 and the viewing screen when closure 65 is open. When open, closure 65 shields the audience from stray light escaping from opening 48.

Figure 6:
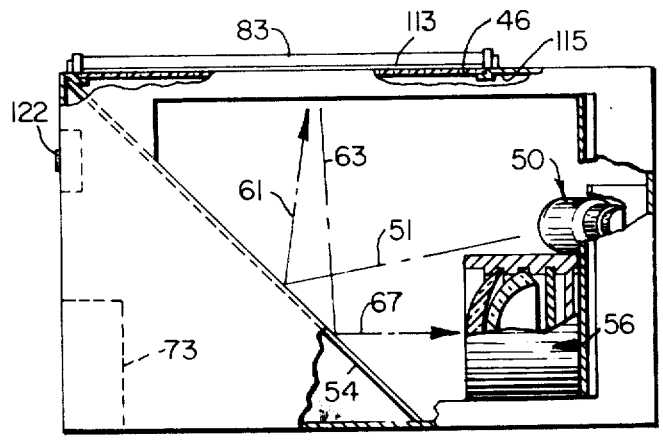
FIG. 6 is a side elevation of the projector of FIG. 5.

As shown in FIGS. 5 and 6, light is directed from lamp 50 along an illuminating axis segment 51 to deflecting mirror 54 and is deflected along an illuminating axis segment 61 and through Fresnel lens 46 to a specularly reflective copy sheet thereon; and imaging light is returned from the copy sheet through the Fresnel lens along an imaging axis segment 63 to deflecting mirror 54, along an imaging axis segment 67 to objective reflector 56 and along projection axis 35 through projection opening 48. It will be understood that, within the projector, the illuminating light diverges along axis segments 51, 61 and the imaging light converges along axis segments 63, 67. A pair of opposed gripping mechanisms 81, 83 at the side edges of Fresnel lens 46, position the copy sheet therebetween in a manner to be described below.

As shown, objective 56 comprises, in sequence, a rearwardly convex front lens 68, a rearwardly convex inner lens 70 and a plane rear mirror 72. Specifically, lens 68 is a positive meniscus and lens 70 is a negative meniscus, which together constitute the front or the rear half of an extreme wide angle symmetrical four element lens hertofore sold by Bausch & Lomb under the trademark "Metrogon". By proper positioning of mirror 72, objective 56 is the catadioptric analog of the aforementioned extreme wide angle lens. Preferably objective 56 has a focal length of at least 125 millimeters (5 inches) and a total field angle of at least 75°. It will be appreciated, however, that the specific configuration of the lenses 68, 70 and mirror 36 is not critical to the herein disclosed combination of Fresnel lens, oblique mirror and catadioptric objective, although, for best results, lens 56 includes at least the combination of a rearward lens having a positively refracting outer surface and a forward mirror. Mirror 72, for example in other configurations is either spherically or aspherically curved to correct third and fifth order aberrations.

As shown at 60 in FIGS. 3 and 4, an opaque copy sheet, when superposed on Fresnel lens 46, presents an upper face for direct observation and a lower face for imaging by objective reflector 56. As suggested by arrows 64, 64 and 66, 66, light rays emerging upwardly through Fresnel lens 46 are substantially parallel or collimated and light rays returned by reflection from copy sheet 60 are substantially parallel or collimated. A fan 73, together with suitable baffles (not shown), causes cooling air flow through opening 48, through the housing and past the lamp in order to maintain acceptable temperatures at the Fresnel lens and at the lamp. Replacing an initial copy sheet 60 by a new copy sheet merely involves superposing the new copy sheet upon copy sheet 60 and, while the new copy sheet is held in place above Fresnel lens 46, withdrawing copy sheet 60 from between the new copy sheet and Fresnel lens 46. It will be appreciated that projector 30 is capable of projecting transparencies which are interposed between Fresnel lens 46 and a plane cover mirror that can be superposed thereon. In one form (not shown) this cover mirror is hinged to housing 30. From the operator's viewing position, the forward and rightward directions of the copy sheet are indicated at 75, 77. These directions, from the audience's viewing position, correspond to the upward and rightward directions of the viewing screen indicated at 79, 85.

The graphic product of FIG. 4 is capable of being manually marked to produce, simultaneously, a visual record for direct observation on the front or upper face and for optical projection from the back or lower face in conjunction with the projector of FIG. 1. This product, comprises a base copy sheet which in laminated sequence, comprises: a visual image receiving, diffusely reflecting stratum 80; a visual image receiving, specularly reflecting stratum 82; and an optionally clear, transparent, polymeric support stratum 84. Each of strata 80, 82 ranges in thickness from 500 to 2500 Angstrom units; and stratum 84 ranges in thickness from 1 to 15 mils. Stratum 82 is composed of a specularly reflecting metal in direct contact with stratum 84. It has been found that a special ink 86, which may be applied from a fibrous pen 87, is capable of chemically reacting with strata 80, 82 to leave an etched mark through both strata. As shown, certain of upwardly incident rays 64, 64 are differentially reflected and certain others are differentially absorbed. In association with the base copy sheet is an erasing patch comprising, in laminated sequence, a diffusely reflecting stratum 110, a specularly reflecting stratum 108, an optically clear transparent polymeric support stratum 106, and an optically clear pressure sensitive stratum 104, containing a special composition, which is capable of chemically reacting with strata 80, 82 to cause them to clear optically. The cleared region of strata 80, 82 enables transmission of light to and from reflecting stratum 108. The erasing patch itself then may be marked as at 112 so that certain of upwardly incident rays 66, 66 are differentially reflected. Analogous thickness dimensions of the strata of the patch and the strata of the base sheet correspond to each other respectively. Stratum 104 typically ranges from 0.5 to 5 mils.

In one specific example: support strata 84, 106 are composed of a dimensionally stable polymer, preferably a uniaxially or biaxially molecularly oriented polymer, for example an olefin such as polyethylene terephthalate, about 10 mils thick; reflecting strata 82, 108 are composed of aluminum or silver that has been vacuum vapor deposited on support strata 84, 106 in a thickness of about 1200 Angstrom units; visual medium 86, 112 is an etching ink, to be described below, containing an opaque, visible pigment such as carbon; stratum 104 is an etching medium, to be described below, which is optically clear; and strata 80, 110, which are diffusely reflecting, contain a metal or metal salt or a water permeable polymer impregnated with a light diffusing dye or pigment.

In the foregoing example specifically, ink 86, 112 and stratum 104 contain (1) a polar solute such as water or methyl alcohol, and (2) a soluble salt of a metal that is lower in the electromotive series than the metals of strata 80, 82 and 108, 110, i.e. is characterized by a readiness to acquire electrons from these metals so as to be reduced in a reaction by which these metals are substituted in the salt. Thus with respect to aluminum, such etchant metals include manganese, zinc, chromium, iron, cadmium, cobalt, nickel, tin, lead, copper, bismuth, antimony, mercury, silver, platinum and gold. For example, when strata 80, 110 are composed of zinc or tin and strata 82, 108 are composed of aluminum the salt typically is a halide, for example, cupric chloride.

In the foregoing example, in one form, strata 80, 110 are composed of a metal containing deposit that has been produced either by chemical or electrochemical plating, or by chemical vapor deposition or vacuum vapor deposition. For example, in one form, strata 80, 110 are composed of diffusely reflecting zinc which has been deposited, at room temperature, from an alkaline aqueous, solution of zinc oxide. In another form, strata 80, 110 are composed of diffusely reflecting tin which has been deposited, at room temperature, from an alkaline aqueous solution of sodium or potassium stannate. In another form, either or both of strata 86, 112 are composed of a water permeable olefin, for example, polyethylene terephthalate, or a water soluble vinyl, for example, polyvinyl alcohol, that ranges from 0.1 to 1 mil in thickness and that contains white pigment particles such as titanium dioxide or zinc oxide.

Figure 8:
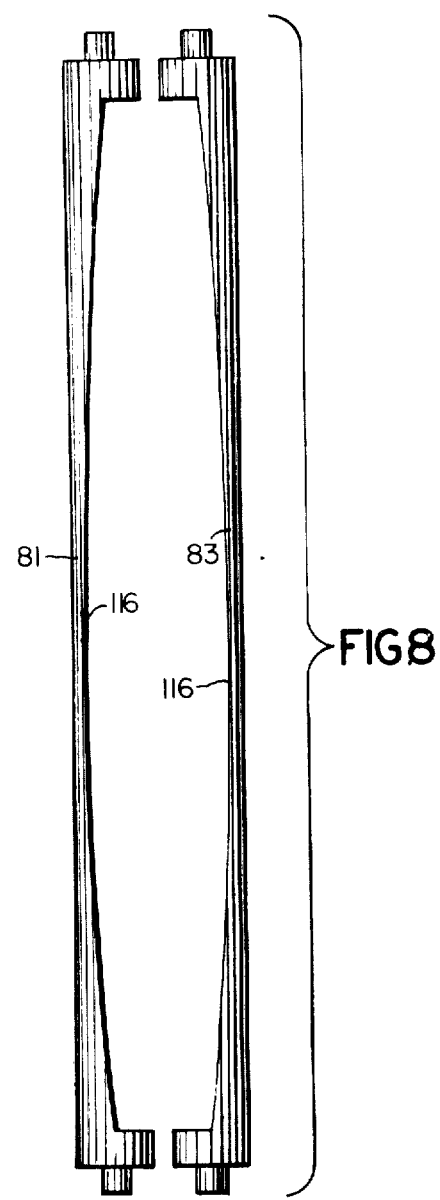
FIG. 8 is a detail plan view of two of the components of FIG. 7.
Figure 7:
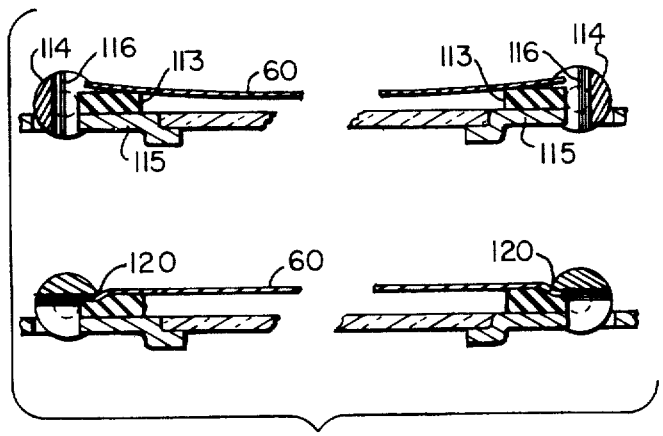
FIG. 7 is a sequence of cross sectional detail views of certain elements of the projector of FIG. 5 in successive stages of operation.

As previously indicated, a pair of gripping mechanisms 81, 83 are positioned at opposite sides of Fresnel lens 46 on stage 32. These mechanisms include components that are elongated to extend along the entire side edges of copy sheet 60 in such a way that the axially oriented molecules lie along an axis that is parallel to the front and rear edges of the Fresnel lens, i.e. perpendicular to the gripping mechanisms. As shown in FIGS. 7 and 8 and with reference to FIG. 9, each of these components includes a stationary elongated, elastomeric reference plate 113 and a rotary elongated clamper 114. Reference plate 113 is backed by a rigid metallic base plate 115 that is affixed to stage 32. Each clamper 114 is in the form of an axially journalled roll having a cut-away portion, which presents an inwardly curved clamping edge 116. The rotational positions of clamper 114, 114 are controlled by a pair of torque motors 118, 118. When clampers 114, 114 are deactuated, reference plates 113, 113 are free to receive a copy sheet, which is shown as having a sagging center because its edges merely rest on the reference plates. When actuated, clamping edges 116, 116 abut tightly against the upper faces of reference plates 113, 113 as at 120, 120, thereby tensioning copy sheet 60 transversely therebetween so that the taut copy sheet lies in a plane defined by the reference plates. The curvatures of clamping edges 116, 116 preclude wrinkling of the copy sheet. The upper surfaces of reference plates 113, 113 are disposed in a plane that is spaced from and above the upper surface of Fresnel lens 46. In consequence the copy sheet is positioned in a displaced optical plane so as to minimize scratching of the Fresnel lens and to defocus its ridges and grooves. Typically, the spacing between these planes ranges from 0.10 to 0.25 inch. The tension produced across the copy sheet is sufficiently great to enable a user to write on the upper surface of the copy sheet without optically distorting this surface perceptibly. Preferably support layer 84 of the copy sheet is of sufficiently high tensile strength to preclude stretching beyond its elastic limit when under high tension and is of sufficient thickness to preclude the formation of wrinkles during generation of the tension. Deenergization of motors 118, 118 permits springs therewithin (not shown) to return clampers 114, 114 to their original positions so that copy sheet 60 is freed for ready removal.

Figure 9:
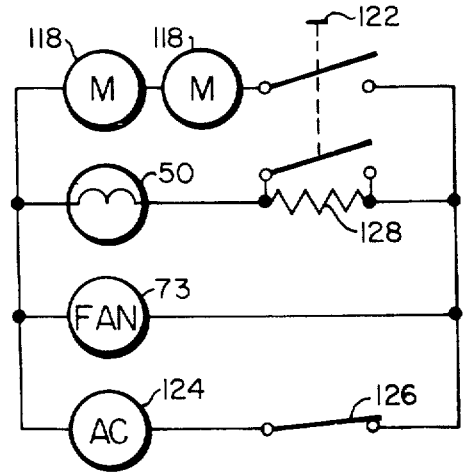
FIG. 9 is an electrical schematic of the control system of the projector of FIG. 1.

The electrical control system of the overhead projector of FIG. 1 is shown in FIG. 9 as including previously mentioned torque motors 118, 118, an electrical latch-unlatch button 122, lamp 50, fan 73, and an electrical input 124. Closing of a switch 126 applies power across fan 73, across lamp 50 and a resistor 128 in series, and for the torque motors in series. Lamp 50 thereby is sufficiently energized only to produce a fade out condition on the screen, a condition that is desirable while copy sheets are being changed. When button 122 is actuated, resistor 128 is shunted out so that lamp 50 projects brightly and motors 118, 118 are energized. In consequence, edges 116, 116 grip the edges of the copy sheet placed on reference plates 113, 113. A second actuation of clamp-inclamp button 112 causes deenergization of torque motors 118, 118 and a low current through lamp 50.

OPERATION AND CONCLUSION

In operation, first switch 126 is closed to energize fan 73 and to partially energize lamp 50 to fade out condition. Next copy sheet 60 is placed on reference plates 113, 113 and button 122 is actuated to tension the copy sheet in contiguity with Fresnel lens 46 and to fully energize lamp 50 to projection condition. The copy sheet is manually marked to produce, simultaneously, a visual record for direct observation from the front and for optical projection from the back. The result is a visual record that is accessible at the upper face of the copy sheet to the eye of the operator and accessible at the under face of the copy sheet to the enclosed folded illuminating the projecting optics of the projector for observation on the screen by the audience.

It will be observed that lamp 50 is below one front corner and objective 56 is below the other front corner of Fresnel lens 46. As a result, with respect to deflecting mirror 54, the angle of incidence of axis segment 51 is equal to the angle of reflection of axis segment 67; and with respect to copy sheet 60, the angle of incidence of axis segment 61 is equal to the angle of reflection of axis segment 63. Furthermore, axis segment 51 is disposed along a path that diverges rearwardly, axis segment 61 is disposed along a path that diverges upwardly, axis segment 63 is disposed along a path that converges downwardly and axis segment 67 is disposed along a path that converges forwardly. Also, on one side of optical axis 31 of lens 56 is viewing screen 33 and on the other side of optical axis 31 of lens 56 aree Fresnel lens 46, copy sheet 60, deflecting mirror 54 and lamp 50.

The focal length of objective 56, which is characterized by continuous optical surfaces of all of its elements at its axis, is responsible for a semi-field that is large enough to encompass Fresnel lens 46 and a short throw by which the distance from the objective to the screen ranges from 900 to 1800 millimeters (3 to 6 feet). The position of objective 56 at the front of housing 30 is adjusted by knob 130 (via a rack and pinion). As the objective is adjusted forwardly toward the audience, the image on the screen becomed larger, thereby not interfering with the limited room available to the operator between the projector and the screen. In a typical system, as shown in FIG. 2, where $s_1$ is the distance from the objective to the Fresnel lens and $s_2$ is the distance from the objective to the screen, the following relationships in inches exist for an objective focal length of 9.6 inches.

| $s_1$ | $s_2$ | $s_2$-$s_1$ | Magnification |
| --- | --- | --- | --- |
| 12 | 48 | 36 | 4 |
| 11.5 | 58 | 46.6 | 5 |
| 11 | 75 | 64.4 | 6.8 |

The arrangement is such that the copy sheet and the image of the copy sheet, in the conjugate planes of objective 56, are on opposite sides of the optical axis of the lens and such that the projector is not very far forwardly of the screen. In other words, the operator and the audience see corresponding visual information on the copy sheet and on the viewing screen at the same time and the audience sees the projector in use and the image on the screen side-by-side. In FIG. 3, the forward and rightward directions on the copy sheet are shown at 75 and 77, respectively, and the upward and rightward directions on the screen are shown at 79 and 85, respectively. It will be appreciated that, although Fresnel lens 46 and the plane defined by reference plates 113, 113 are generally horizontal, the phrase "generally horizontal" is intended to include inclined planes that provide visual and manual access to an operator from above. Similarly, although screen 33 is generally vertical, the phrase "generally vertical" is intended to include inclined planes that provide visual and manual access from in front.

The present invention thus provides a variety of systems involving opaque projection, which ensure: simultaneous, direct optical and mechanical access to the subject by the operator; absolute shielding of the operator and the audience from internal light; no interposition of the optical system between the audience and the screen; and natural posture of the operator at the projector. Since certain changes may be made in the foregoing disclosure, without departing from the scope of the invention hereof, it is intended that all matter described in the foregoing specification and shown in the accompanying drawings, be interpreted in an illustrative and not in a limiting sense.

What is claimed is:

1. A large copy projector for imaging a visual sheet on a viewing screen, said projector comprising:
   a. fresnel field lens means having a first axis;
   b. wide angle catadioptric objective reflector means having a second axis;
   c. said first axis and said second axis being crossed with respect to each other;
   d. deflecting mirror means obliquely disposed with respect to said first axis and said second axis;
   e. said objective reflector means establishing a first semi-field conjugate surface and a second semi-field conjugate surface;
   f. said first semi-field conjugate surface including said visual sheet in association with said Fresnel lens means;
   g. said second semi-field conjugate surface including said viewing screen;
   h. said deflecting mirror means establishing a folded path involving said Fresnel field lens means and said first semi-field conjugate surface; and
   i. lamp means for illuminating said folded path below said Fresnel field lens means.

2. The large copy projector of claim 1 wherein said objective reflector includes at least positive lens means and mirror means said positive lens means presenting at least a convex surface optically toward said first semi-field conjugate surface and said second semi-field conjugate surface, said mirror means receiving light through said convex surface and returning light through said convex surface.

3. The large copy projector of claim 1 wherein said lamp means projects light through said visual sheet and said Fresnel field lens means.

4. The large copy projector of claim 1 wherein the front face of said visual sheet is accessible visually and manually to an operator and the rear face of said visual sheet presents imaging light that is inverted by said deflecting mirror and that is inverted twice and reverted by said catadioptric reflector.

5. The large copy projector of claim 1 wherein the axis of illuminating light from said lamp means diagonally intersects the plane of said surface of said Fresnel lens.

6. A large copy optical projector for imaging a generally horizontal copy sheet on a generally vertical screen spaced from said projector, said copy sheet having an upper face and a lower face and being in association with a specular reflector, said optical projector comprising;
   a. housing means defining an enclosed chamber, said housing means having a forward portion, a rearward portion and a substantially horizontal upper portion, said upper portion having a first opening throughout a major portion of its area, said opening defining the field of said copy sheet;
   b. flat Fresnel lens means at said opening in said upper portion, said Fresnel lens means being substantially coextensive with said opening in said upper portion;
   c. said copy sheet, when in superposed relation with said Fresnel lens means, being substantially coextensive therewith and having substantially the entire upper face of said copy sheet accessible visually and manually to an operator;
   d. said housing means having a second opening, objective lens means at said second opening for receiving imaging light along an imaging path and defining an optical axis;
   e. lamp means in said chamber for directing illuminating light along an illuminating path;

f. deflecting mirror means underlying said Fresnel lens means within said chamber, said deflecting mirror means slanting downwardly from said rear portion toward said front portion;

g. catadioptric objective reflector means at said front portion;

h. said illuminating light diverging in said illuminating path along a first illuminating axis segment communicating with said deflective mirror means and then being reflected along a second illuminating axis segment communicating with said Fresnel lens means;

i. said imaging light reflected from said copy sheet being converged by said Fresnel lens in said imaging path along a first imaging axis segment communicating with said deflecting mirror means, next being reflected along a second imaging axis to said objective reflector, and then being reflected along a third axis segment to said viewing screen;

j. said lamp means and said objective reflector means being at opposite edges of said Fresnel lens means.

7. A large copy projector for imaging a visual sheet on a viewing screen, said projector comprising:

a. field lens means having a first axis;

b. wide angle catadioptric objective reflector means having a second axis;

c. said first axis and said second axis being crossed with respect to each other;

d. deflecting mirror means obliquely disposed with respect to said first axis and said second axis;

e. said objective reflector means establishing a first semi-field conjugate surface and a second semi-field conjugate surface;

f. said first semi-field conjugate surface including said visual sheet in association with said field lens means;

g. said second semi-field conjugate surface including said viewing screen;

h. said deflecting mirror means establishing a folded path involving said field lens means and said first semi-field conjugate surface; and i. lamp means for illuminating said folded path below said field lens means.

* * * * *